(12) United States Patent
McCown

(10) Patent No.: US 6,421,810 B1
(45) Date of Patent: Jul. 16, 2002

(54) SCALABLE PARALLEL TEST BUS AND TESTING METHOD

(75) Inventor: Hal C. McCown, Ft. Worth, TX (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/305,495

(22) Filed: May 5, 1999

(51) Int. Cl.[7] .............................................. G06F 17/50
(52) U.S. Cl. ........................................................ 716/4
(58) Field of Search .................... 716/4, 5, 7; 714/726, 714/30, 37, 724, 742, 743; 324/158.1

(56) References Cited

U.S. PATENT DOCUMENTS

| 4,720,672 A | * | 1/1988 | Turino .................... 340/825.62 |
| 5,436,910 A | * | 7/1995 | Takeshima et al. .......... 714/718 |
| 6,006,343 A | * | 12/1999 | Whetsel ........................ 714/28 |
| 6,049,901 A | * | 4/2000 | Stock et al. ................. 714/726 |
| 6,078,540 A | * | 6/2000 | Keeth .......................... 365/226 |

OTHER PUBLICATIONS

Matsuda et al, "A New Array Architecture For Parallel Testing in VLSI Memories," IEEE, 1989, pp. 322–326.*
Lee Whetsel, "Addressable Test Ports An Approach to Testing Embedded Cores," IEEE, Sep. 1999.*

* cited by examiner

Primary Examiner—Vuthe Siek
(74) Attorney, Agent, or Firm—Girard & Equitz LLP

(57) ABSTRACT

An apparatus for and method of testing similar circuit blocks with test signals. The apparatus includes a first logic bus circuit, a second logic bus circuit, and a selector circuit. The first logic bus circuit is used to serially test the similar circuit blocks. The second logic bus circuit is used to concurrently test the similar circuit blocks. The selector circuit indicates an error with a high impedance circuit state. The number of output pins is dependent upon the number of test signals, not the number of similar circuit blocks. This allows the apparatus to be scalable to any number of similar circuit blocks without increasing the required number of output pins.

33 Claims, 3 Drawing Sheets

SCALABLE PARALLEL TEST BUS AND TESTING METHOD

BACKGROUND OF THE INVENTION

1. Field of the Invention

The present invention relates to test circuits. In particular, the invention relates to test circuits for testing integrated circuits (ICs), IC boards, and IC systems that employ multiple similar functional circuit blocks.

2. Description of the Related Art

Many electronic integrated circuits (ICs), IC boards, and IC systems employ multiple similar circuit blocks. Similar circuit blocks may be defined as circuit blocks that are deterministic; that is, they are each designed to produce, within the same timing window, the same set of outputs when all the circuit blocks receive the same inputs. Often similar circuit blocks are identical, that is, they consist of the exact same circuit elements connected in exactly the same way. In order to verify that the circuit blocks are working as required, some sort of testing procedure is required during the manufacturing process. These circuit blocks can be tested either serially or concurrently. Serial testing works well for defect detection and isolation, but can significantly increase test time. Concurrent testing also works well for defect detection and isolation, but requires a larger number of external control and monitor signals (e.g., latched register bits).

Testing with latched register bits operates as follows. First, the register bits are cleared and the test pattern is started. Next, any error(s) in the pattern set the appropriate bit(s). Normally the bits cannot be cleared except by a hardware reset or the start of a new test pattern. Then, the test pattern ends. Finally, the register bits are read to determine their pass/fail status.

Register bits thus have two disadvantages. First, the test pattern must read a register to determine its pass/fail status, taking additional time. Second, there is no information on the location or nature of the failure, only a binary pass/fail indication.

Thus, there is a need for a test circuit for defect detection and isolation that has a reduced test time as compared to serial testing and a reduced number of external control and monitor signals (or register bits) as compared to concurrent testing.

SUMMARY OF THE INVENTION

The present invention addresses these and other problems of the prior art with an apparatus for and method of testing similar circuit blocks with test signals.

According to one embodiment, an apparatus includes a test circuit and has a first plurality of logic bus circuits, a second plurality of logic bus circuits, and a plurality of selector circuits. Each of the first plurality of logic bus circuits is configured to receive a plurality of input signals corresponding to both a plurality of similar circuit blocks and a respective test signal, and to receive a plurality of select signals corresponding to the plurality of similar circuit blocks, and in accordance therewith generate a plurality of intermediate output signals. The second plurality of logic bus circuits is coupled to the first plurality of logic bus circuits. Each of the second plurality of logic bus circuits is configured to receive a corresponding set of the plurality of intermediate output signals, and in accordance therewith generate a respective test output signal. The plurality of selector circuits is coupled to the first and second pluralities of logic bus circuits. Each of the plurality of selector circuits is configured to receive the corresponding set of the plurality of intermediate output signals and the respective test output signal, and in accordance therewith generate a final output. The final output corresponds to either the respective test output signal or a high-impedance circuit state indicative of an error. The plurality of select signals selectively designate which of the plurality of input signals that the first logic bus circuit uses to generate the plurality of intermediate output signals.

According to another embodiment, a method includes the steps of generating a plurality of test signals; generating, with a plurality of similar circuit blocks, a plurality of input signals corresponding to both the plurality of similar circuit blocks and the plurality of test signals; and receiving the plurality of input signals as a result of the step of generating the plurality of input signals. The method further includes the steps of generating a plurality of select signals corresponding to the plurality of similar circuit blocks, wherein the plurality of select signals selectively designate at least one of the plurality of input signals; generating a plurality of intermediate output signals, in accordance with the step of receiving and the step of generating the plurality of select signals; and generating a plurality of test output signals, in accordance with the step of generating the plurality of intermediate output signals. The method finally includes the step of generating a plurality of final outputs, in accordance with the step of generating the plurality of intermediate output signals and the step of generating the plurality of test output signals, wherein each of the plurality of final outputs corresponds to either one of the plurality of test output signals or a high-impedance circuit state indicative of an error, and wherein the number of the plurality of final outputs corresponds, independently of the number of the plurality of similar circuit blocks, to the number of the plurality of test signals.

A better understanding of the features and advantages of the present invention will be obtained by reference to the following detailed description and accompanying drawings which set forth illustrative embodiments in which the principles of the invention are utilized.

DETAILED DESCRIPTION OF THE PREFERRED EMBODIMENTS

Figure 1:
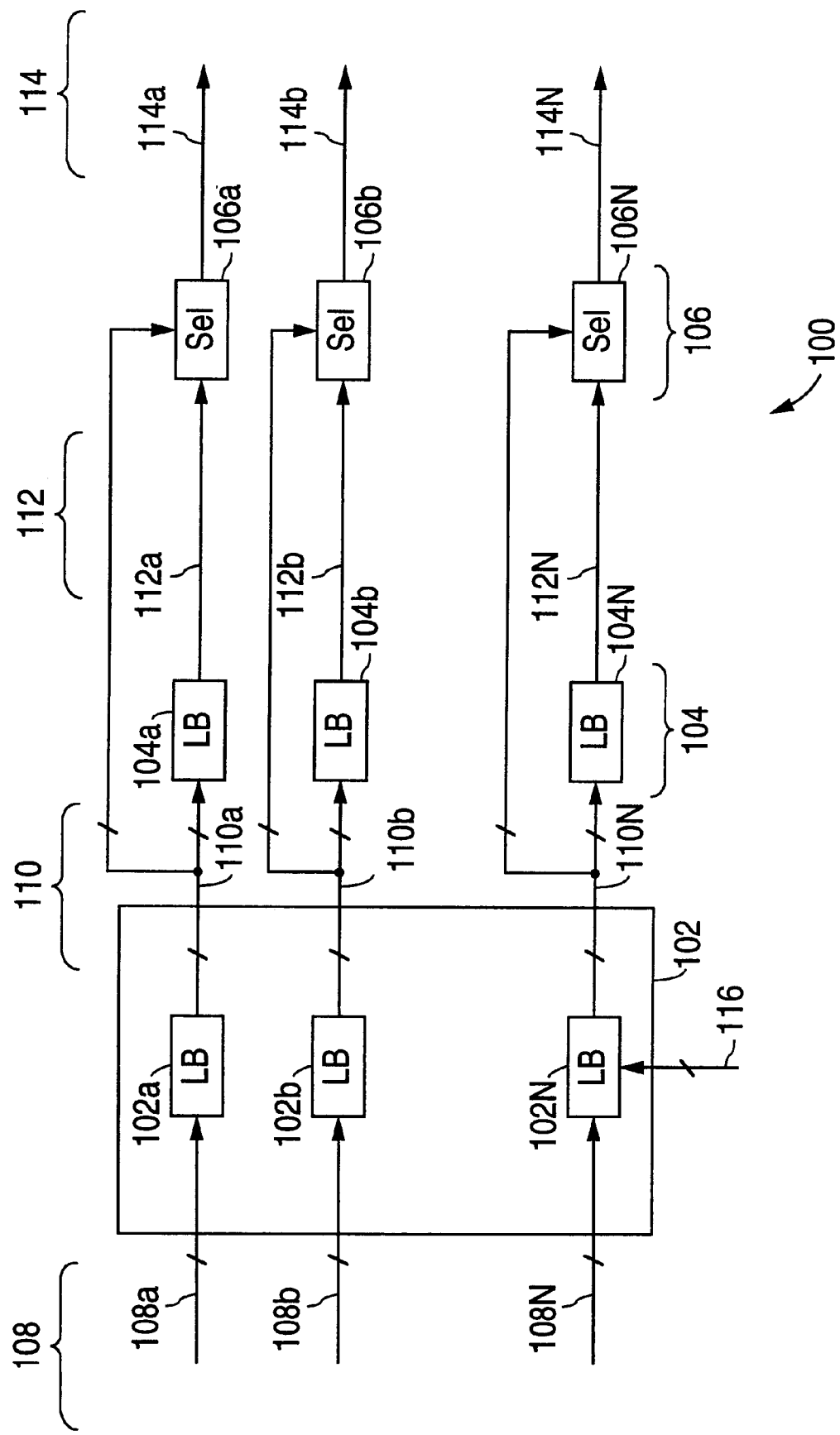
FIG. 1 is a block diagram of a test circuit according to the present invention.

FIG. 1 shows a test circuit 100 including a first logic bus circuit 102, a second logic bus circuit 104, and a selector circuit 106. First logic bus circuit 102 is configured to receive N input signals 108 and a number of select signals 116. First logic bus circuit 102 is configured to generate N intermediate output signals 110. First logic bus circuit 102 includes N subcircuits 102a, 102b, etc. Subcircuit 102a receives input signals 108a and generates intermediate output signals 110a.

Second logic bus circuit 104 includes N subcircuits 104a, 104b, etc. Second logic bus circuit 104 receives intermediate output signals 110 and generates N test output signals 112. Subcircuit 104a receives intermediate output signal 10a and generates test output signal 112a.

Selector circuit 106 includes N subcircuits 106a, 106b, etc., receives intermediate output signals 110 and test output signals 112, and generates N final outputs 114. Subcircuit 106a receives intermediate output signals 110a and test output signal 112a, and generates final output 114a.

Each of the N final outputs 114 corresponds to either a corresponding one of test output signals 112 or a high-impedance circuit state indicative of an error. More specifically, when a test input signal 174 (see FIG. 3) is provided to M circuit blocks 172 (see FIG. 3), each circuit block generates one of the M signals that together make up input signals 108a(for example) (see FIG. 1). Subcircuit 102a then generates intermediate output signals 110a, which subcircuit 104a compares to generate test output signal 112a. Subcircuit 106a also compares intermediate output signals 110a. If intermediate output signals 110a do not all match, subcircuit 106a indicates an error by generating a high-impedance circuit state as final output 114a. If intermediate output signals 110a do match, subcircuit 106a passes test output signal 112a as final output 114a.

Figure 3:
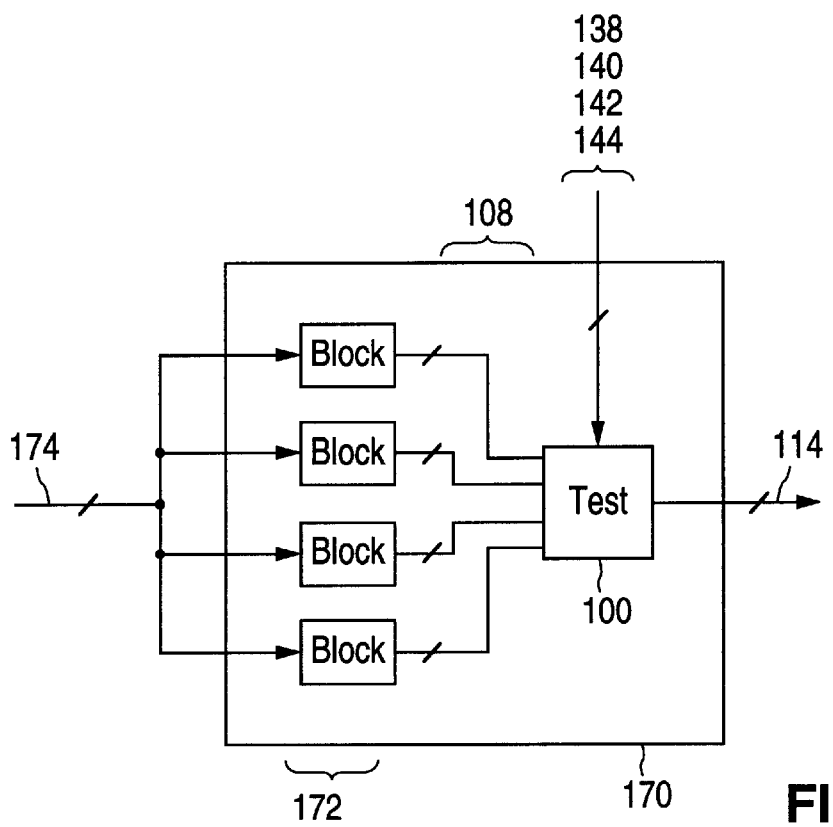
FIG. 3 is a block diagram of an apparatus including the test circuit of FIG. 1.

Each test input signal 174 is provided to all of the M circuit blocks 172 (see FIG. 3). Each of the subcircuits of 102, 104, and 106 (e.g., the subcircuits 102a, 104a, and 106a) (see FIG. 1) then corresponds to all of the M circuit blocks and one of the test input signals. Therefore, the number of final outputs corresponds to the number of test input signals N, not the number of circuit blocks M. Thus, the number of output pins required for testing purposes can be reduced without using register bits, and any number of circuit blocks can be tested without increasing the required number of output pins. A large number of circuit blocks can be tested concurrently while only requiring the same number of control and monitor signals as testing of a single circuit block. Furthermore, the M circuit blocks can be tested concurrently, saving time.

Select signals 116 indicate which of the input signals 108 the first logic bus circuit 102 uses to generate the intermediate output signals 110. In this manner, one or more of the M circuit blocks may be selectively tested. Each circuit block can be serially tested for fault isolation.

Figure 2:
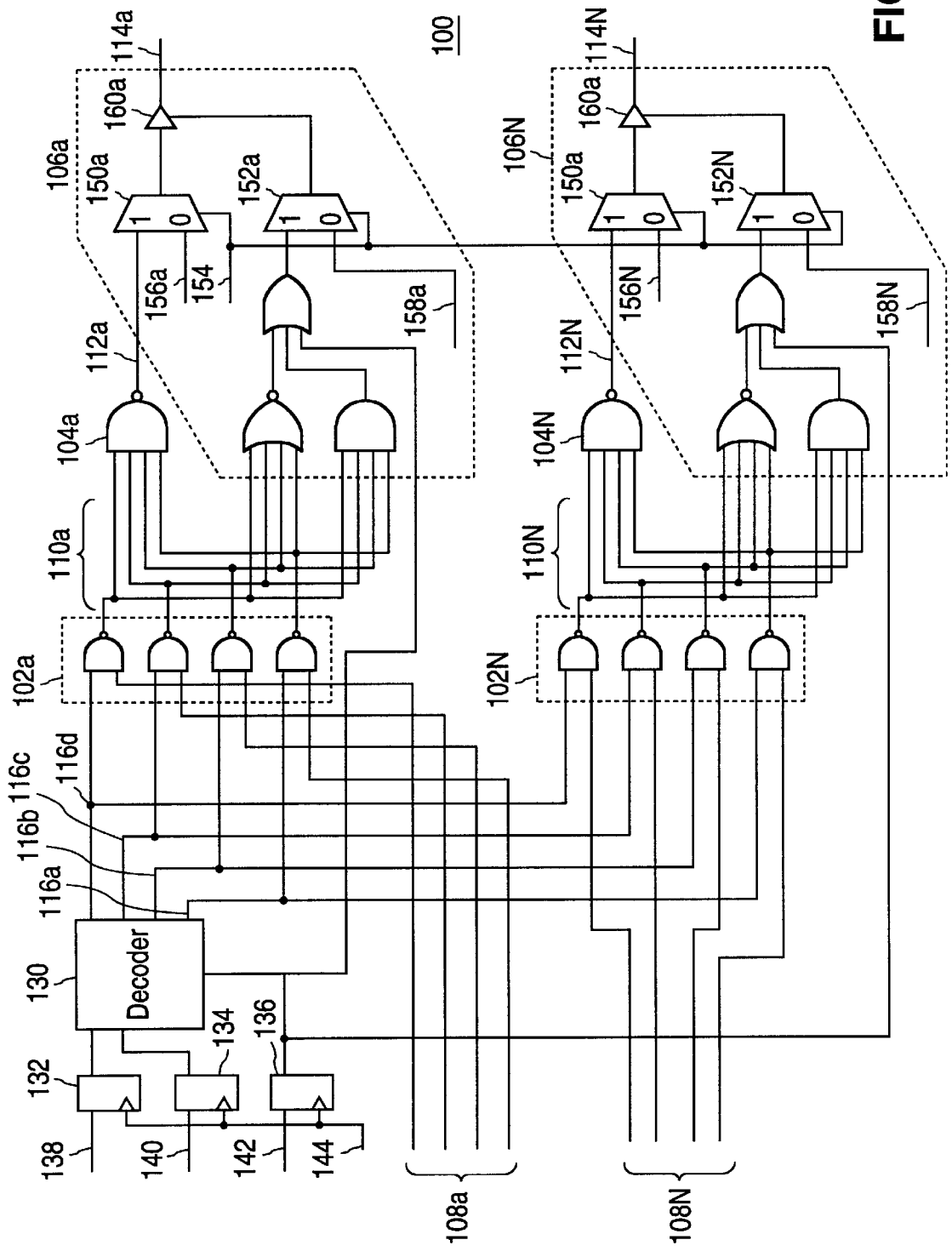
FIG. 2 is a block diagram showing more detail of the test circuit of FIG. 1.

FIG. 2 shows more detail of test circuit 100. In this figure, test circuit 100 is designed to test four (M=4) similar circuit blocks 172 with N test input signals 174 (see FIG. 3). Other quantities of circuit blocks can be tested with slight modifications as will be apparent from the following description.

Each of the N first logic bus circuits 102 includes four NAND gates. Each of the N second logic bus circuits 104 includes one NAND gate. Each of the N selector circuits 106 includes a NOR gate, an AND gate, an OR gate, one each of multiplexer circuits 150a–N and 152a–N, and one of output stage circuits 160a–N.

Test enable signal 154 indicates whether test circuit 100 is to operate in a test mode or in a non-test output mode. Non-test output signals 156a–N are the non-test outputs generated by the circuit blocks when not in the test mode. Non-test output enable signals 158a–N indicate that the non-test output signals 156a–N should be output as final outputs 114a–N. The multiplexers 150a–N use test enable signal 154 to select either one of the N test output signals 112 or one of the N non-test output signals 156. The multiplexers 152a–N use test enable signal 154 to select either one of the outputs of the OR gates or one of the non-test output enable signals 158a–N.

Output stage circuits 160a–N operate as simple input-output pads; more specifically, as high-impedance buffers with active high enables. When enabled, output stage circuits 160a–N pass the output of the multiplexers 150a–N as final outputs 114a–N; otherwise, they present a high-impedance output impedance.

Select signals 116 are generated by a decoder 130 and flip-flops 132, 134, and 136, which may be standard D-type flip-flops. Each select signal 116a, 116b, 116c, and 116d corresponds to one of the circuit blocks. The quantity of two flip-flops 132 and 134 result from a base-two representation of four. That is, the signals 138 and 140 can exist in one of four states {00, 01, 10, 11}. Decoder 130 then converts the two signals 138 and 140 into the four signals 116a–d. In this manner, signals 138 and 140 together indicate which one of the circuit blocks is to be tested.

Mode signal 142, when high or low, indicates whether the test circuit 100 is to operate in single-block or multiple-block mode, respectively. If mode signal 142 indicates single-block mode, decoder 130 uses signals 138 and 140 raise high one of the select signals 116a–d. If mode signal 142 indicates multiple-block mode, decoder 130 raises all the select signals 116a–d high.

Clock signal 144 controls the single-block mode and is either an synchronous or clocked write signal to the three flip-flops 132, 134 and 136.

In single-block mode, one of the select signals 116a–d, corresponding to the block to be tested, is high. The input signals 108a–N are then supplied to the N first logic bus circuits 102, which generate intermediate output signals 110a–N. Second logic bus circuits 104a–N generate N final outputs 114 based on intermediate output signals 110a–N. Thus, final outputs 114a–N correspond to the N test input signals applied to one of the circuit blocks.

As an example of single-block operation, the N test input signals 174 are provided to the M circuit blocks 172 (see FIG. 3), which generate input signals 108. Now referring to the "a" subcircuits (see FIG. 2), each NAND gate in first logic bus subcircuit 102a receives one of the input signals 108a and a corresponding one of the select signals 116a–d. If the corresponding signal of input signals 108a is high, one of the intermediate output signals 110a is low and the rest are high, causing second logic bus subcircuit 104a to make test output signal 112a high. The latched mode signal 142 causes the OR circuit to generate a high signal. Test enable signal 154 is in a high state and causes multiplexer 152a to provide the high OR output signal to and thereby enable output stage circuit 160a, which causes it to provide high test output signal 112a as final output 114a. This high output can then be compared with the input test signal to determine if there has been an error.

Similarly, if the corresponding signal of input signals 108a is low, second logic bus subcircuit 104a generates a low test output signal 112a, which output stage circuit 160a passes as final output 114a as in the single-block mode. This low output can then be compared with the input test signal to determine if there has been an error.

In multiple-block mode, all of the select signals 116a–d are high. The input signals 108a–N are then supplied to the N first logic bus circuits 102, which generate intermediate output signals 110a–N. Second logic bus circuits 104a–N compare, and selector circuits 106a–N compare and verify, intermediate output signals 110a–N, resulting in final outputs 114a–N. Thus, final outputs 114a–N correspond to the N test input signals applied to all of the circuit blocks.

Note that in multiple-block mode, select signals 116 and first logic bus circuits 102 are not needed. Therefore, test circuit 100 may be modified to perform only in multiple-block mode as follows. First logic bus circuits 102, decoder 130, and flip-flops 132, 134 and 136 may be omitted. The NAND gates 104 may be replaced with AND gates to eliminate signal inversion. As so modified, input signals 108 would be supplied directly as intermediate output signals 110.

As an example of multiple-block operation, the N test input signals 174 are provided to the M circuit blocks 172 (see FIG. 3), which generate input signals 108. Now referring to the "a" subcircuits (see FIG. 2), each NAND gate in first logic bus subcircuit 102a receives one of the input signals 108a and a corresponding one of the select signals 116a–d. If all of intermediate output signals 110a are high, second logic bus subcircuit 104a generates a low test output signal 112a. If all of intermediate output signals 110a are low, second logic bus subcircuit 104a generates a high test output signal 112a. If intermediate output signals 110a include both high and low, second logic bus circuit 104a generates a high test output signal 112a.

Further, if all of intermediate output signals 110a are high, the AND gate in selector subcircuit 106a will generate a high signal. If all of intermediate output signals 110a are low, the NOR gate in selector subcircuit 106a will generate a high signal. At least one high input will cause the OR gate in selector subcircuit 106a to output a high signal, enabling output stage circuit 160a (via multiplexer 152a) to provide final output 112a as final output 114a. On the other hand, if intermediate output signals 110a are both high and low, the OR gate in selector subcircuit 106a outputs a low signal, causing output stage circuit 160a to provide a high-impedance circuit state as final output 114a, thereby indicating an error.

Thus, multiple-port mode allows concurrent testing with the high-impedance circuit states quickly indicating an error. If necessary, the specific defective block may then be identified through serial testing in single-block mode, with the high-impedance circuit state again indicating the error. In this manner, testing may be performed quickly with a minimum of external pins.

FIG. 3 shows test circuit 100 embodied on a device 170 (e.g., an IC or an IC board) with four similar circuit blocks 172. A number of test signals 174 are provided to circuit blocks 172. Circuit blocks 172 then generate input signals 108, which are provided to test circuit 100, which operates as described above. Device 170 may also be configured to operate in a non-test output mode, in which case it receives non-test input signals in place of test signals 174, and generates non-test output signals 156, also as described above. This embodiment is useful for periodic testing of circuit blocks because the device does not have to be deinstalled or attached to a separate device for testing.

Figure 4:
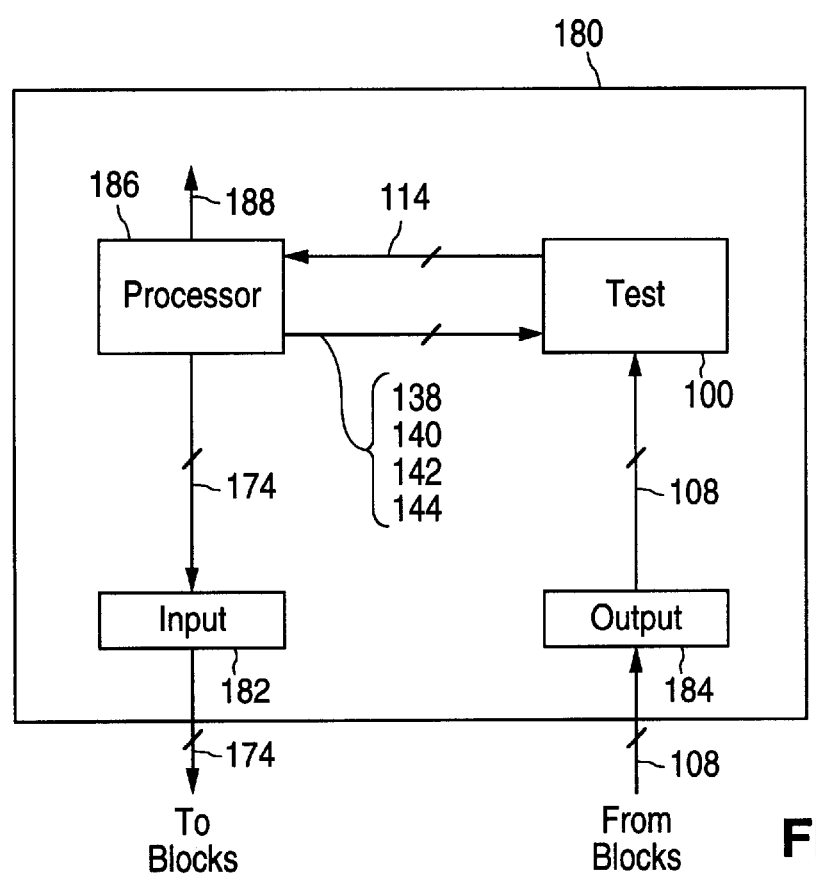
FIG. 4 is a block diagram of a test unit including the test circuit of FIG. 1.

FIG. 4 shows test circuit 100 embodied in a test device 180 separate from the similar circuit blocks. This is useful for infrequent testing of the circuit blocks because the device containing the circuit blocks must be coupled to test device 180, which may involve time and effort. However, it has the advantage of not requiring test circuit 100 to be embodied on the same device as the circuit blocks. Test device 180 includes an input port 182, an output port 184, and a processor circuit 186.

Input port 182 is configured to transmit the N test signals 174 to the M similar circuit blocks (not shown). Output port 184 is coupled to test circuit 100. Output port 184 is configured to receive the N input signals 108 from the similar circuit blocks. Processor circuit 186 is coupled to input port 182 and test circuit 100. Processor circuit 186 is configured to generate test signals 174 and to receive the N final outputs 114, and in accordance therewith generate error information 188. Processor circuit 186 may be further configured to generate signals 138 and 140, mode signal 142, and clock signal 144 for test circuit 100.

Note that test circuit 100 corresponds to FIG. 2, except that multiplexers 150 and 152, test enable signal 154, non-test output signals 156, and non-test output enable signals 158 are not required. This is because these elements and signals are only necessary when test circuit 100 is further configured to generate non-test outputs. Of course, non-test outputs are unnecessary when performing explicit testing with test device 180.

The present invention may be used in both production and debugging environments. In an IC production environment, the testing is performed after the fabrication or assembly of the device containing the circuit blocks. The embodiment of FIG. 4 may be used because it is not necessary to continuously perform such production testing.

In an IC debugging environment, the embodiment of either FIG. 3 or FIG. 4 may be used. Testing is performed on the circuit blocks, and the defective blocks are identified. The IC or board containing the defective blocks may then be replaced, and testing is then performed again to verify that the blocks are no longer defective.

It should be understood that various alternatives to the embodiments of the invention described herein may be employed in practicing the invention. It is intended that the following claims define the scope of the invention and that structures within the scope of these claims and their equivalents are covered thereby.

What is claimed is:

1. An apparatus including a test circuit for testing similar circuit blocks with test signals, comprising:
    a logic bus circuit configured to receive a plurality of input signals corresponding to both a plurality of similar circuit blocks and a plurality of test signals, and in accordance therewith generate a plurality of test output signals; and
    a selector circuit, coupled to said logic bus circuit, said selector circuit configured to receive said plurality of test output signals and said plurality of input signals, and in accordance therewith generate a plurality of final outputs, wherein each of said plurality of final outputs corresponds to either one of said plurality of test output signals or a high-impedance circuit state indicative of an error;
    wherein a quantity of said plurality of final outputs corresponds, independently of a quantity of said plurality of similar circuit blocks, to a quantity of said plurality of test signals.

2. An apparatus including a test circuit for testing similar circuit blocks with test signals, comprising:
    a logic bus circuit configured to receive a plurality of input signals corresponding to both a plurality of similar circuit blocks and a plurality of test signals, and in accordance therewith generate a plurality of test output signals; and
    a selector circuit, coupled to said logic bus circuit, said selector circuit configured to receive said plurality of test output signals and said plurality of input signals, and in accordance therewith generate a plurality of final outputs, wherein each of said plurality of final outputs corresponds to either one of said plurality of test output signals or a high-impedance circuit state indicative of an error, wherein a quantity of said plurality of final outputs corresponds, independently of a quantity of said plurality of similar circuit blocks, to a quantity of said plurality of test signals, and wherein said logic bus circuit comprises:

a plurality of subsidiary bus circuits, each of said plurality of subsidiary bus circuits configured to receive a subset of said plurality of input signals, and in accordance therewith generate a subset of said plurality of test output signals, wherein said subset of said plurality of input signals corresponds to one of said plurality of test signals.

3. The apparatus of claim 2, wherein each of said plurality of subsidiary bus circuits comprises:

a logic circuit configured to logically combine said subset of said plurality of input signals and in accordance therewith generate said subset of said plurality of test output signals.

4. An apparatus including a test circuit for testing similar circuit blocks with test signals, comprising:

a logic bus circuit configured to receive a plurality of input signals corresponding to both a plurality of similar circuit blocks and a plurality of test signals, and in accordance therewith generate a plurality of test output signals; and a selector circuit, coupled to said logic bus circuit, said selector circuit configured to receive said plurality of test output signals and said plurality of input signals, and in accordance therewith generate a plurality of final outputs, wherein each of said plurality of final outputs corresponds to either one of said plurality of test output signals or a high-impedance circuit state indicative of an error, wherein a quantity of said plurality of final outputs corresponds, independently of a quantity of said plurality of similar circuit blocks, to a quantity of said plurality of test signals, and wherein said selector circuit comprises:

a plurality of subsidiary selector circuits, each of said plurality of subsidiary selector circuits configured to receive a subset of said plurality of input signals and a subset of said plurality of test output signals, and in accordance therewith generate a subset of said plurality of final outputs, wherein said subset of said plurality of input signals corresponds to one of said plurality of test signals, and said subset of said plurality of test output signals corresponds to said one of said plurality of test signals.

5. The apparatus of claim 4, wherein each of said plurality of subsidiary selector circuits comprises:

a NOR circuit configured to receive said subset of said plurality of input signals, and in accordance therewith generate a NOR output signal;

an AND circuit configured to receive said subset of said plurality of input signals, and in accordance therewith generate an AND output signal;

an OR circuit, coupled to said NOR circuit and said AND circuit, said OR circuit configured to receive said NOR output signal and said AND output signal, and in accordance therewith generate an OR output signal; and an output stage, coupled to said logic bus circuit and said OR circuit, said output stage configured to receive one of said plurality of test output signals and said OR output signal, and in accordance therewith generate one of said plurality of final outputs.

6. The apparatus of claim 1, wherein:

said selector circuit is further configured to receive a test enable signal and a plurality of non-test output signals, and in accordance therewith selectively generate a plurality of final non-test output signals as said plurality of final outputs.

7. The apparatus of claim 1, further comprising:

said plurality of similar circuit blocks, coupled to said logic bus circuit, said plurality of similar circuit blocks configured to receive said plurality of test signals and in accordance therewith generate said plurality of input signals.

8. An apparatus including a test circuit for testing similar circuit blocks with test signals, comprising:

a logic bus circuit configured to receive a plurality of input signals corresponding to both a plurality of similar circuit blocks and a plurality of test signals, and in accordance therewith generate a plurality of test output signals;

a selector circuit, coupled to said logic bus circuit, said selector circuit configured to receive said plurality of test output signals and said plurality of input signals, and in accordance therewith generate a plurality of final outputs, wherein each of said plurality of final outputs corresponds to either one of said plurality of test output signals or a high-impedance circuit state indicative of an error, wherein a quantity of said plurality of final outputs corresponds, independently of a quantity of said plurality of similar circuit blocks, to a quantity of said plurality of test signals; and a processor circuit, coupled to said selector circuit, said processor circuit configured to generate said plurality of test signals and to receive said plurality of final outputs, and in accordance therewith generate an error signal that indicates when said plurality of final outputs fails to correspond to said plurality of test signals.

9. An apparatus including a test circuit for testing similar circuit blocks with test signals, comprising:

a plurality of logic bus circuits, each of said plurality of logic bus circuits configured to receive a plurality of input signals corresponding to both a plurality of similar circuit blocks and a respective test signal, and in accordance therewith generate a respective test output signal; and a plurality of selector circuits, coupled to said plurality of logic bus circuits, each of said plurality of selector circuits configured to receive said respective test output signal and a corresponding set of said plurality of input signals, and in accordance therewith generate a final output, wherein said final output corresponds to either said respective test output signal or a high-impedance circuit state indicative of an error.

10. The apparatus of claim 9, wherein each of said plurality of logic bus circuits comprises:

a logic circuit configured to logically combine said corresponding set of said plurality of input signals and in accordance therewith generate said respective test output signal.

11. An apparatus including a test circuit for testing similar circuit blocks with test signals, comprising:

a plurality of logic bus circuits, each of said plurality of logic bus circuits configured to receive a plurality of input signals corresponding to both a plurality of similar circuit blocks and a respective test signal, and in accordance therewith generate a respective test output signal; and a plurality of selector circuits, coupled to said plurality of logic bus circuits, each of said plurality of selector circuits configured to receive said respective test output signal and a corresponding set of said plurality of input signals, and in accordance therewith generate a final output, wherein said final output corresponds to either said respective test output signal or a high-impedance circuit state indicative of an error, wherein each of said plurality of selector circuits comprises:

a NOR circuit configured to receive said corresponding set of said plurality of input signals, and in accordance therewith generate a NOR output signal;

an AND circuit configured to receive said corresponding set of said plurality of input signals, and in accordance therewith generate an AND output signal;

an OR circuit, coupled to said NOR circuit and said AND circuit, said OR circuit configured to receive said NOR output signal and said AND output signal, and in accordance therewith generate an OR output signal; and an output stage, coupled to a corresponding one of said plurality of logic bus circuits and said OR circuit, said output stage configured to receive said respective test output signal and said OR output signal, and in accordance therewith generate said final output.

12. The apparatus of claim 9, wherein:

each of said plurality of selector circuits is further configured to receive a test enable signal and a non-test output signal, and in accordance therewith selectively generate a final non-test output signal as said final output.

13. The apparatus of claim 9, further comprising:

said plurality of similar circuit blocks, coupled to said plurality of logic bus circuits, said plurality of similar circuit blocks configured to receive each said respective test signal and in accordance therewith generate said plurality of input signals.

14. An apparatus including a test circuit for testing similar circuit blocks with test signals, comprising:

a plurality of logic bus circuits, each of said plurality of logic bus circuits configured to receive a plurality of input signals corresponding to both a plurality of similar circuit blocks and a respective test signal, and in accordance therewith generate a respective test output signal;

a plurality of selector circuits, coupled to said plurality of logic bus circuits, each of said plurality of selector circuits configured to receive said respective test output signal and a corresponding set of said plurality of input signals, and in accordance therewith generate a final output, wherein said final output corresponds to either said respective test output signal or a high-impedance circuit state indicative of an error; and a processor circuit, coupled to said plurality of selector circuits, said processor circuit configured to generate each said respective test signal and to receive each said final output, and in accordance therewith generate an error signal that indicates when each said final output fails to correspond to each said respective test signal.

15. An apparatus including a test circuit for testing similar circuit blocks with test signals, comprising:

a first logic bus circuit configured to receive a plurality of input signals corresponding to both a plurality of similar circuit blocks and a plurality of test signals, and to receive a plurality of select signals corresponding to said plurality of similar circuit blocks, and in accordance therewith generate a plurality of intermediate output signals;

a second logic bus circuit, coupled to said first logic bus circuit, said second logic bus circuit configured to receive said plurality of intermediate output signals and in accordance therewith generate a plurality of test output signals; and a selector circuit, coupled to said first logic bus circuit and said second logic bus circuit, said selector circuit configured to receive said plurality of intermediate output signals and said plurality of test output signals, and in accordance therewith generate a plurality of final outputs, wherein each of said plurality of final outputs corresponds to either one of said plurality of test output signals or a high-impedance circuit state indicative of an error;

wherein a quantity of said plurality of final outputs corresponds, independently of a quantity of said plurality of similar circuit blocks, to a quantity of said plurality of test signals, and wherein said plurality of select signals selectively designate which of said plurality of input signals that said first logic bus circuit uses to generate said plurality of intermediate output signals.

16. The apparatus of claim 15, wherein said first logic bus circuit comprises:

a plurality of subsidiary bus circuits, each of said plurality of subsidiary bus circuits configured to receive said plurality of select signals and a subset of said plurality of input signals, and in accordance therewith generate a subset of said plurality of intermediate output signals, wherein said subset of said plurality of input signals corresponds to one of said plurality of test signals.

17. The apparatus of claim 16, wherein each of said plurality of subsidiary bus circuits comprises:

a plurality of logic circuits, each configured to logically combine one of said plurality of select signals and one of said subset of said plurality of input signals and in accordance therewith generate one of said subset of intermediate output signals.

18. The apparatus of claim 15, wherein said second logic bus circuit comprises:

a plurality of subsidiary bus circuits, each of said plurality of subsidiary bus circuits configured to receive a subset of said plurality of intermediate output signals, and in accordance therewith generate a subset of said plurality of test output signals, wherein said subset of said plurality of intermediate output signals corresponds to one of said plurality of test signals.

19. The apparatus of claim 18, wherein each of said plurality of subsidiary bus circuits comprises:

a logic circuit configured to logically combine said subset of said plurality of intermediate output signals and in accordance therewith generate said subset of said plurality of test output signals.

20. The apparatus of claim 15, wherein said selector circuit comprises:

a plurality of subsidiary selector circuits, each of said plurality of subsidiary selector circuits configured to receive a subset of said plurality of intermediate output signals and a subset of said plurality of test output signals, and in accordance therewith generate a subset of said plurality of final outputs, wherein said subset of said plurality of intermediate output signals corresponds to one of said plurality of test signals, and said subset of said plurality of test output signals corresponds to said one of said plurality of test signals.

21. The apparatus of claim 20, wherein each of said plurality of subsidiary selector circuits comprises:

a NOR circuit configured to receive said subset of said plurality of intermediate output signals, and in accordance therewith generate a NOR output signal;

an AND circuit configured to receive said subset of said plurality of intermediate output signals, and in accordance therewith generate an AND output signal;

an OR circuit, coupled to said NOR circuit and said AND circuit, said OR circuit configured to receive said NOR output signal and said AND output signal, and in accordance therewith generate an OR output signal; and an output stage, coupled to said second logic bus circuit and said OR circuit, said output stage configured to receive one of said plurality of test output signals and said OR output signal, and in accordance therewith generate one of said plurality of final outputs.

22. The apparatus of claim 15, wherein:

said selector circuit is further configured to receive a test enable signal and a plurality of non-test output signals, and in accordance therewith selectively generate a plurality of final non-test output signals as said plurality of final outputs.

23. The apparatus of claim 15, further comprising:

said plurality of similar circuit blocks, coupled to said first logic bus circuit, said plurality of similar circuit blocks configured to receive said plurality of test signals and in accordance therewith generate said plurality of input signals.

24. The apparatus of claim 15, further comprising:

a processor circuit, coupled to said selector circuit, said processor circuit configured to generate said plurality of test signals and to receive said plurality of final outputs, and in accordance therewith generate an error signal that indicates when said plurality of final outputs fails to correspond to said plurality of test signals.

25. An apparatus including a test circuit for testing similar circuit blocks with test signals, comprising:

a first plurality of logic bus circuits, each of said first plurality of logic bus circuits configured to receive a plurality of input signals corresponding to both a plurality of similar circuit blocks and a respective test signal, and to receive a plurality of select signals corresponding to said plurality of similar circuit blocks, and in accordance therewith generate a plurality of intermediate output signals;

a second plurality of logic bus circuits, coupled to said first plurality of logic bus circuits, each of said second plurality of logic bus circuits configured to receive a corresponding set of said plurality of intermediate output signals, and in accordance therewith generate a respective test output signal; and a plurality of selector circuits, coupled to said first and second pluralities of logic bus circuits, each of said plurality of selector circuits configured to receive said corresponding set of said plurality of intermediate output signals and said respective test output signal, and in accordance therewith generate a final output, wherein said final output corresponds to either said respective test output signal or a high-impedance circuit state indicative of an error;

wherein said plurality of select signals selectively designate which of said plurality of input signals that said first plurality of logic bus circuits uses to generate said plurality of intermediate output signals.

26. The apparatus of claim 25, wherein each of said first plurality of logic bus circuits comprises:

a plurality of logic circuits, each configured to logically combine one of said plurality of select signals and one of said plurality of input signals and in accordance therewith generate one of said plurality of intermediate output signals.

27. The apparatus of claim 25, wherein each of said second plurality of logic bus circuits comprises:

a logic circuit configured to logically combine said corresponding set of said plurality of intermediate output signals and in accordance therewith generate said respective test output signal.

28. The apparatus of claim 25, wherein each of said plurality of selector circuits comprises:

a NOR circuit configured to receive said corresponding set of said plurality of intermediate output signals, and in accordance therewith generate a NOR output signal;

an AND circuit configured to receive said corresponding set of said plurality of intermediate output signals, and in accordance therewith generate an AND output signal;

an OR circuit, coupled to said NOR circuit and said AND circuit, said OR circuit configured to receive said NOR output signal and said AND output signal, and in accordance therewith generate an OR output signal; and an output stage, coupled to a corresponding one of said second plurality of logic bus circuits and said OR circuit, said output stage configured to receive said respective test output signal and said OR output signal, and in accordance therewith generate said final output.

29. The apparatus of claim 25, wherein:

each of said plurality of selector circuits is further configured to receive a test enable signal and a non-test output signal, and in accordance therewith selectively generate a final non-test output signal as said final output.

30. The apparatus of claim 25, further comprising:

said plurality of similar circuit blocks, coupled to said first plurality of logic bus circuits, each of said plurality of similar circuit blocks configured to receive said respective test signal and in accordance therewith generate said plurality of input signals.

31. The apparatus of claim 25, further comprising:

a processor circuit, coupled to said plurality of selector circuits, said processor circuit configured to generate each said respective test signal and to receive each said final output, and in accordance therewith generate an error signal that indicates when each said final output fails to correspond to each said respective test signal.

32. A method of testing similar circuit blocks with test signals, comprising the steps of:

generating a plurality of test signals;

generating, with a plurality of similar circuit blocks, a plurality of input signals corresponding to both said plurality of similar circuit blocks and said plurality of test signals;

receiving said plurality of input signals as a result of said step of generating said plurality of input signals;

generating a plurality of test output signals, in accordance with said step of receiving; and generating a plurality of final outputs, in accordance with said step of receiving and said step of generating said plurality of test output signals, wherein each of said plurality of final outputs corresponds to either one of said plurality of test output signals or a high-impedance circuit state indicative of an error, wherein a quantity of said plurality of final outputs corresponds, independently of a quantity of said plurality of similar circuit blocks, to a quantity of said plurality of test signals.

33. A method of testing similar circuit blocks with test signals, comprising the steps of:

generating a plurality of test signals;

generating, with a plurality of similar circuit blocks, a plurality of input signals corresponding to both said plurality of similar circuit blocks and said plurality of test signals;

receiving said plurality of input signals as a result of said step of generating said plurality of input signals;

generating a plurality of select signals corresponding to said plurality of similar circuit blocks, wherein said plurality of select signals selectively designate at least one of said plurality of input signals;

generating a plurality of intermediate output signals, in accordance with said step of receiving and said step of generating said plurality of select signals;

generating a plurality of test output signals, in accordance with said step of generating said plurality of intermediate output signals; and generating a plurality of final outputs, in accordance with said step of generating said plurality of intermediate output signals and said step of generating said plurality of test output signals, wherein each of said plurality of final outputs corresponds to either one of said plurality of test output signals or a high-impedance circuit state indicative of an error, and wherein a quantity of said plurality of final outputs corresponds, independently of a quantity of said plurality of similar circuit blocks, to a quantity of said plurality of test signals.

* * * * *